United States Patent
Ferran et al.

(10) Patent No.: US 10,680,294 B2
(45) Date of Patent: Jun. 9, 2020

(54) METHOD FOR MANAGING A BATTERY ACCORDING TO ITS STATE OF HEALTH

(71) Applicant: Airbus SAS, Blagnac (FR)

(72) Inventors: Benoit Ferran, Paris (FR); Emmanuel Joubert, Issy-les-Moulineaux (FR); Clément Dinel, Issy-les-Moulineaux (FR)

(73) Assignee: Airbus SAS, Blagnac (FR)

( * ) Notice: Subject to any disclaimer, the term of this patent is extended or adjusted under 35 U.S.C. 154(b) by 72 days.

(21) Appl. No.: 15/951,380

(22) Filed: Apr. 12, 2018

(65) Prior Publication Data
US 2018/0301767 A1   Oct. 18, 2018

(30) Foreign Application Priority Data
Apr. 13, 2017 (FR) .................................. 17 53261

(51) Int. Cl.
*H02J 7/00* (2006.01)
*H01M 10/48* (2006.01)
(Continued)

(52) U.S. Cl.
CPC .......... *H01M 10/48* (2013.01); *G01R 31/382* (2019.01); *G01R 31/392* (2019.01); *H01M 10/44* (2013.01);
(Continued)

(58) Field of Classification Search
CPC .... H01M 10/48; H01M 10/44; G01R 31/392; G01R 31/382; H02J 7/0063
(Continued)

(56) References Cited

U.S. PATENT DOCUMENTS

2008/0204031 A1* 8/2008 Iwane .................. G01R 31/389
                                                      324/430
2013/0073236 A1* 3/2013 Wu ........................ H01M 10/48
                                                      702/63
(Continued)

FOREIGN PATENT DOCUMENTS

| CN | 105391080 | 3/2016 |
| FR | 3002045 | 8/2014 |
| JP | 2008039526 | 2/2008 |

OTHER PUBLICATIONS

European Search Report, dated Feb. 23, 2017, priority document.

*Primary Examiner* — Zixuan Zhou
(74) *Attorney, Agent, or Firm* — Greer, Burns & Crain Ltd.

(57) ABSTRACT

A method for managing a battery according to a state of health of the battery, comprising, prior to using the battery, predetermining a maximum depth of discharge profile according to the state of health of the battery, the profile being dependent on a technology of the battery, on a nominal energy level to be made available each time the battery is discharged, the nominal energy level being substantially constant over a service life of the battery. While using the battery, a maximum depth of discharge of the battery is adjusted at regular intervals, each time the state of health of the battery decreases by a percentage corresponding to an update interval p % that is equal to p/100, that is, for all state of health values ($SOH_n$) that are equal to $SOH_0 - n \times p$ %, where n is an integer comprised between 0 and 20/p.

7 Claims, 2 Drawing Sheets

(51) Int. Cl.
  *G01R 31/382* (2019.01)
  *H01M 10/44* (2006.01)
  *G01R 31/392* (2019.01)
(52) U.S. Cl.
  CPC ..... *H02J 7/0063* (2013.01); *H02J 2007/0067* (2013.01)
(58) Field of Classification Search
  USPC .......................................... 320/134; 324/426
  See application file for complete search history.

(56) References Cited

U.S. PATENT DOCUMENTS

2015/0367744 A1  12/2015  Saint-Marcoux et al.
2016/0359203 A1  12/2016  Schmiegel \* cited by examiner

METHOD FOR MANAGING A BATTERY ACCORDING TO ITS STATE OF HEALTH

CROSS-REFERENCES TO RELATED APPLICATIONS

This application claims the benefit of the French patent application No. 1753261 filed on Apr. 13, 2017, the entire disclosures of which are incorporated herein by way of reference.

TECHNICAL FIELD

The field of the invention is that of electrical accumulator batteries.

More particularly, the field of the invention is that of the management of batteries according to their state of health.

BACKGROUND OF THE INVENTION

An electrical accumulator battery is subject to two ageing processes:
cycling: the cycles of charging and discharging cause the battery to deteriorate;
over time: prolonged storage of the battery results in corrosion reactions damaging the battery over time.

The ageing of a battery manifests as a decrease in its capacity and an increase in its internal resistance.

A state of health (SOH), defined as a ratio of the storage capacity of a battery at a time t to the capacity of the battery at the start of life, characterizes the ageing of the battery. In general, a state of health of 80% is considered to be characteristic of a battery at the end of life. A battery considered to be at the end of life has therefore lost 20% of its capacity and its internal resistance has increased, by about 30% for a lithium-ion battery.

Thus, a battery having for example a capacity of 96 A.h at the start
of life has a capacity of only 77 A.h at the end of life.

Nowadays, the batteries installed on board aircraft with all-electric propulsion have a service life of about one year. The relatively rapid deterioration of these batteries constitutes an operational drawback, since the energy capacity of the battery decreases over time, reducing their autonomy.

One envisageable solution to this problem is to use batteries having a longer service life. One drawback of this solution is the very high cost of this type of battery.

U.S. Patent Application US 2016/0167541 describes a method for monitoring the electrical controls of a vehicle. A torque to be applied to the vehicle depends on a position of the accelerator pedal. There is a risk that the current imposed on the batteries is higher than necessary, if the accelerator pedal is depressed beyond the required position, causing the battery to age prematurely. The method described in the U.S. patent application manages the temperature of the battery by virtue of a cooling system and limits the torque to be applied if this torque could bring about damage to the battery.

However, although this method slows the ageing of the battery, it does not
make it possible to maintain a substantially constant level of energy performance independently of its state of health.

French patent FR3002045 describes a method for managing the charge of a battery according to which the maximum permissible state of charge of the battery is limited, which limit increases as the battery ages, so as to anticipate the decrease in the energy capacity of the battery and to maintain a constant available energy level over the service life of the battery.

One drawback of this method is that it does not take the discharge level into account, i.e., the battery undergoes premature ageing in the event of an overly deep discharge.

SUMMARY OF THE INVENTION

The invention relates to a method for managing a battery according to a state of health SOH of the battery.

According to the invention, the method includes:
prior to using the battery, a step of predetermining a maximum depth of discharge MDOD profile according to the state of health SOH of the battery, the profile being dependent on a technology of the battery, on a nominal energy level to be made available each time the battery is discharged, the nominal energy level being substantially constant over a service life of the battery, i.e., between a start of life state SOH0 associated with an initial maximum depth of discharge value MDOD0 and an end of life state SOH20 associated with a maximum depth of discharge limit threshold value MDOD20;
while using the battery, a step of adjusting a maximum depth of discharge MDOD of the battery according to the state of health SOH of the battery.

In one embodiment, the maximum depth of discharge MDOD of the battery is adjusted at regular intervals, each time the state of health SOH of the battery decreases by a percentage corresponding to an update interval p % that is equal to p/100, i.e., for all state of health values SOHn that are equal to SOH0−n×p %, where n is an integer comprised between 0 and 20/p.

In one embodiment, the maximum depth of discharge $MDOD_n$ of the battery is adjusted to the state of health $SOH_n$ according to the following relation:

$$MDOD_n = \left(\frac{1}{1 - p/100}\right)^n MDOD_0$$

In one embodiment, the initial value MDOD0 and the maximum depth of discharge MDOD profile are determined in the predetermination step such that the depth of discharge of the battery is, over the service life of the battery, always or nearly always lower than a maximum value.

In one embodiment, the initial value MDOD0 and the depth of discharge MDOD profile are determined according to the limit threshold value MDOD20.

In one embodiment, a maximum charge setpoint is provided during the charging phases of the battery, the maximum charge setpoint varying upwards following a variation profile that is similar to the maximum depth of discharge (MDOD) profile, so as to maintain a substantially constant available energy level over the service life of the battery while limiting overcharge-related risks.

BRIEF DESCRIPTION OF THE DRAWINGS

The invention will be better understood upon reading the description which follows and upon examining the accompanying figures. These are provided only by way of completely nonlimiting indication of the invention.

DETAILED DESCRIPTION OF THE PREFERRED EMBODIMENTS

A deterioration due to the ageing of a battery is characterized hereinafter by a state of ageing SOA.

The state of ageing SOA is defined as the complement of a state of health SOH:

SOA[%]=100%−SOH[%]

The state of health SOH and the state of ageing SOA are advantageously determined during use by a battery management system BMS.

A start of life of the battery is thus characterized by a state of ageing SOA0 of 0%. An end of life of the battery is generally associated with a state of ageing SOA20 of 20% corresponding to a state of health SOH80 of 80%. This value of the state of ageing at the end of life will be used throughout the rest of the description, but those skilled in the art will understand that this is only a generally used convention and that the end of life of the battery may be associated with another value.

According to the value used, at the end of life, a capacity of the battery has decreased by 20% and an internal resistance of the battery has increased.

A depth of discharge DOD of the battery is defined as a percentage electric charge consumed in one discharging phase with respect to the capacity of the battery at the state of ageing SOA of interest.

Thus, a depth of discharge DOD50 of 50% corresponds to a battery which has been half discharged and a depth of discharge DOD100 of 100% corresponds to a battery which has been fully discharged.

Deep discharges of the battery are generally avoided and reserved for exceptional situations inasmuch as they bring about phenomena, such as, for example, sulfation or cell loss depending on the technology of the battery, leading to a premature ageing of the battery.

The term "deep discharge" is understood to mean a depth of discharge beyond a threshold value, which threshold value depends on the technology of the battery but is generally comprised between 50% and 70%.

During a "deep discharge," a voltage U of the battery is no longer substantially equal to a nominal value Unom and drops substantially below a discharge threshold value, generally comprised between 50% and 70%. Consequently, at discharge isopower, an amount of energy consumed between a state of charge of 80% and a state of charge of 60% is higher than an amount of energy consumed between a state of charge of 50% and a state of charge of 30%, for one and the same difference in state of charge.

The invention takes this limitation into account.

Figure 1:
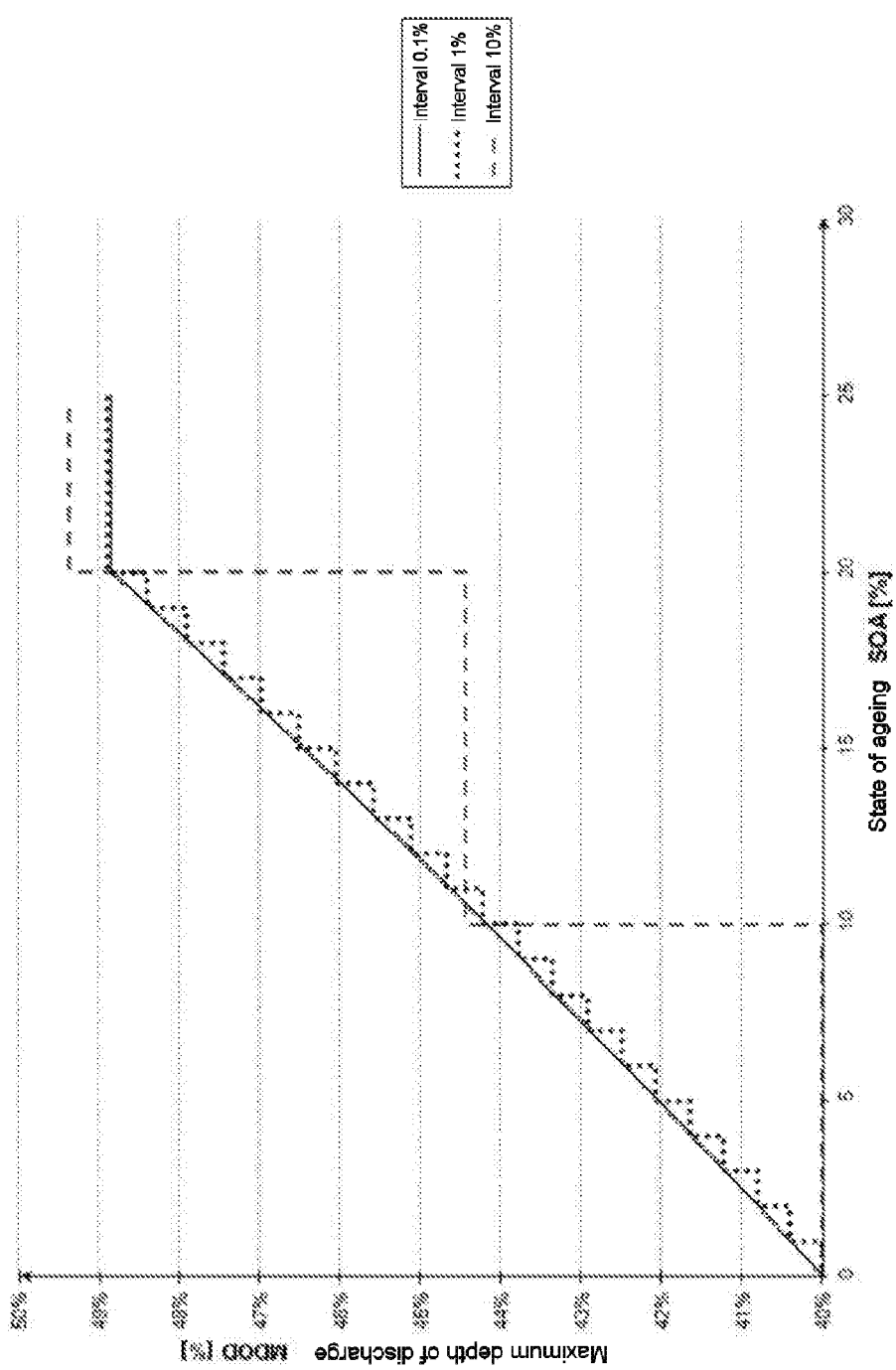
FIG. 1 shows three different maximum depth of discharge profiles according to the state of ageing of the battery, according to the invention.

With reference to FIG. 1, a maximum depth of discharge MDOD is determined and set for each discharge of the battery according to a state of ageing SOA of the battery determined by the management system BMS.

The maximum depth of discharge MDOD is set, at the start of life of the battery, to a start of life value MDOD0, here 40%. The maximum depth of discharge MDOD then increases with the age of the battery, following an upwards profile, until reaching a limit threshold value MDOD20 beyond a limit age of the battery. In practice, the limit age as of which the maximum depth of discharge MDOD profile reaches the limit threshold value MDOD20 is the end-of-life age corresponding to the state of ageing SOA20.

FIG. 1 thus illustrates, nonlimitingly, three different possible variation profiles for one and the same battery according to the method of the invention.

The start of life value MDOD0 and the variation profile are predetermined and the limit threshold value MDOD20 may be deduced from these two items of information, as will be understood later. Advantageously, the start of life value MDOD0 and the variation profile are chosen to account for the problems related to overly deep discharges (cell loss or sulfation, for example) and will be determined such that the depth of discharge over the service life of the battery remains less than or equal to 50%. Of course, those skilled in the art will understand that this value may be increased or decreased, while still however accounting for the problems related to deep discharges, without limiting the scope of the invention.

When a state of ageing SOAn, characterizing the ageing of the battery in a step n, increases by an interval of 1% in step n+1 to reach a state of ageing SOAn+1,1%, the capacity of the battery decreases by 1%, resulting in a decrease of about 1% in an energy capacity corresponding to a maximum amount of energy that can be stored in the battery at a given time.

To compensate for this decrease in the energy capacity, the maximum depth of discharge MDODn+1,1% at the state of ageing SOAn+1,1% is increased with respect to the maximum depth of discharge MDODn in step n, according to the following relation:

$$MDOD_{n+1,1\%} = \frac{1}{1 - {}^1/_{100}} MDOD_n$$

In this way, an amount of energy E that is available during a discharge between a zero state of discharge and the depth of discharge MDODn is substantially constant over the entire service life of the battery.

In the above example, an interval of 1% is considered, but the maximum depth of discharge may be readjusted for different update intervals, for example 0.5%, 2% or 10%. For an update interval of p %, corresponding to an ageing of the battery by p %, the preceding relation becomes:

$$MDOD_{n+1,p\%} = \frac{1}{1 - {}^p/_{100}} MDOD_n$$

Of course, the smaller the interval p %, the greater the number of readjustments undergone by the maximum depth of discharge MDOD and the more optimal the management of the battery with regard to consumable energy, an overly large interval p % not allowing a substantially constant energy consumption over the repeated discharges of the battery over its entire life cycle.

By way of numerical example, a fully charged battery having an amount of energy at the start of life of 30 kW.h is considered. The initial value MDOD0 is set to 40%. An amount of energy E0 at the start of life of the battery that is consumable during discharge is therefore approximately equal to 12 kW.h.

It is assumed that the maximum depth of discharge is readjusted for the for the first time in mid-life, i.e., for a state of ageing SOA10 of 10%. The maximum amount of energy stored in the battery and then approximately equal to 27 kW.h. The interval p % is equal to 10%, and the maximum depth of discharge MDOD10 is set to:

$$MDOD_{10} = \frac{1}{1 - {}^{10}/_{100}} \frac{40}{100} = \frac{40}{90} \approx 44.4\%$$

According to the invention, the amount of energy E10 that is consumable during a discharge in mid-life is therefore approximately equal to:

$$E_{10} = \frac{40}{90} \times 27 = 12 \text{ kW} \cdot \text{h}$$

The useful energy capacity E10 that is consumable in mid-life, after readjustment of the depth of discharge profile, is therefore indeed equal to the useful energy capacity E0 that is consumable at the start of life.

However, the interval p % used is relatively large, such that, during a first half of the service life of the battery, the maximum depth of discharge is set to 40%. Consequently, the amount of energy E that is consumable during the discharges taking place in this time period has to decrease. For example, when the battery has reached a quarter of its service life, i.e., a state of ageing SOA5 of 5%, the consumable energy E5 is approximately equal to:

$$E_5 = \frac{40}{100} \times 28.5 = 11.4 \text{ kW} \cdot \text{h}$$

To maintain the substantially constant amount of consumable energy E over the service life of the battery, a relatively small interval p % is advantageously retained, for example smaller than or equal to 1%.

Assuming an interval p % of 1%, the maximum depth of discharge MDOD5 becomes:

$$MDOD_5 = \left(\frac{1}{1 - {}^{1}/_{100}}\right)^5 \frac{40}{100} \approx 42.1\%$$

The consumable energy E5 is then approximately equal to:

$$E_5 = \left(\left(\frac{1}{1 - {}^{1}/_{100}}\right)^5 \frac{40}{100}\right) \times 28.5 \approx 12 \text{ kW} \cdot \text{h}$$

The useful energy capacity E5 during a discharge when the battery has reached a quarter of its service life is therefore substantially equal to the useful energy capacity that is consumable at the start of life.

It should be noted that the predetermined depth of discharge MDOD values in the method according to the invention are maximum values allowing a substantially constant amount of consumable energy to be made available over the entire service life of the battery. These depth of discharge values are not necessarily reached in practice.

The maximum depth of discharge MDOD profiles over the service life of the battery, for an initial value of 40% and intervals of 0.1%, 1% and 10%, are illustrated in FIG. 1.

The profile shown as a solid line represents the variation in the maximum depth of discharge MDOD for an interval of 0.1%. The variation profile is substantially affine. The threshold value MDOD20 is about 48.86%.

The profile shown as a dotted line represents the variation in the maximum depth of discharge MDOD for an interval of 1%. The threshold value MDOD20 is about 48.90%.

The profile shown as a dashed line represents the variation in the maximum depth of discharge MDOD for an interval of 10%. The threshold value MDOD20 is about 49.38%.

The maximum depth of discharge still remains less than 50%.

It should be noted that the variation profile of the maximum depth of discharge determined by the above relation is particularly suitable for relatively small depth of discharge value ranges, which depend on the technologies of the battery but are generally less than or equal to 60%.

Figure 2:
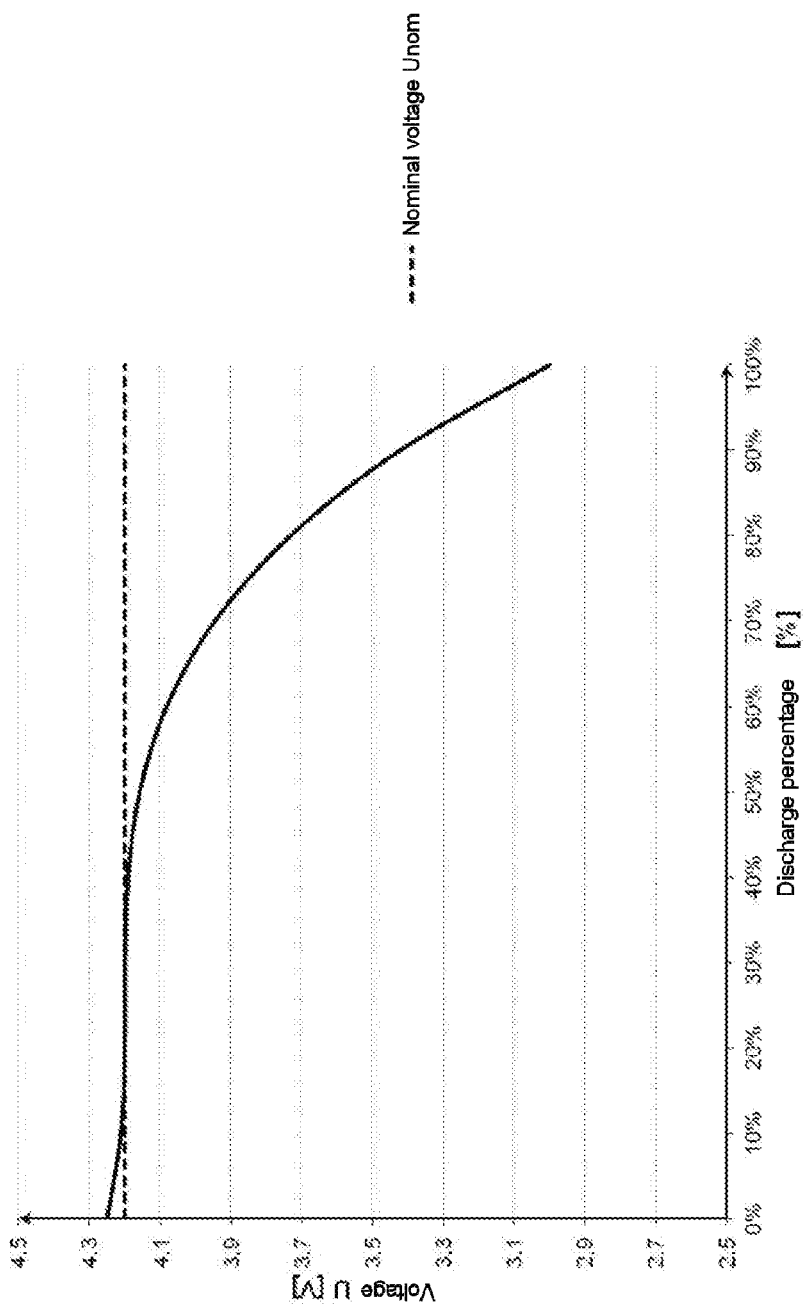
FIG. 2 shows a discharge curve of a battery.

FIG. 2 illustrates a discharge curve, represented as a solid line, of a battery having a nominal voltage Unom of 4.2 V represented by a dashed line. The voltage U across the terminals of the battery is substantially constant and equal to the nominal voltage Unom over the discharge range [0%-60%], but substantially decreases beyond that, characterizing a deep discharge.

In FIG. 2, the term "discharge percentage" is understood to mean the ratio of quantity of electric charge consumed at the state of discharge under consideration to the capacity of the battery.

Given the relationship between electric charge and electrical energy, a consumption of electric charge is therefore substantially equivalent to a consumption of electrical energy in the zone in which the voltage is substantially constant, i.e., outside the deep discharge zone. Stated otherwise, over these ranges of values, a consumption of electric charge equal to 1% of the capacity of the battery is equivalent to an energy consumption of 1% of the energy capacity of the battery. Deeper discharges give rise to a notable decrease in the voltage across the terminals of the battery. Under these conditions, the electric charge/electrical energy equivalence is no longer valid and the depth of discharge must be increased accordingly to compensate for the decrease in the voltage and to maintain a constant energy capacity, accelerating the ageing of the battery.

In particular, it should be noted that the final value MDOD20 may be expressed as a function of the initial value MDOD0:

$$MDOD_{20} = \left(\frac{1}{1 - {}^{p}/_{100}}\right)^{20/p} MDOD_0$$

The initial value MDOD0 and the variation profile of the maximum depth of discharge characterized by the interval p % may therefore be adjusted such that the end-of-life value MDOD20 does not exceed a threshold value.

For a threshold value of 50% for example, and an interval of 1%, the MDOD0 value not to be exceeded is:

$$MDOD_0 = \left(\frac{1}{1 - {}^{1}/_{100}}\right)^{-20} \times 50\% = 40.9\%$$

Thus, the battery management method according to the invention allows the ageing of a battery to be limited while allowing a substantially constant energy consumption over the entire service life of the battery.

Limiting the depth of discharge makes it possible to avoid the problems related to deep discharge, under nominal conditions.

Of course, in one mode of implementation, for safety reasons, the method according to the invention allows deeper discharges in the case of an emergency or in particular situations for which a greater amount of energy than expected is required, for example, in the case in which an aircraft is not able to land and is placed in a holding stack or diverted to another airport.

It should be noted that, analogously, it is also possible to keep an energy level available during a discharge which is substantially constant over the service life of the battery by allowing increasingly deeper charges over the service life of the battery.

For example, the BMS may provide a charge setpoint of 80% at the start of life, then gradually increase the charge setpoint over the service life of the battery, for example according to a formula equivalent to formula (1), only this time applied to a charge setpoint.

These methods may be implemented separately or conversely be combined by setting a maximum depth of discharge and a maximum charge setpoint which both vary over the service life of the battery, one advantage of this combination being to limit both overcharge-related risks and risks related to a deep discharge.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for managing a battery according to a state of health of the battery, comprising:
    prior to using the battery, a step of determining and setting a maximum depth of discharge profile according to the state of health of the battery, the maximum depth of discharge profile being a percentage maximum electrical discharge consumed in a single discharging phase of the battery with respect to the capacity of the battery at that discharge phase, and said maximum depth of discharge profile being dependent on a technology of the battery, on a nominal energy level to be made available each time the battery is discharged, the nominal energy level being substantially constant over a service life of the battery, that is, between a start of life state ($SOH_0$) associated with an initial maximum depth of discharge value ($MDOD_0$) and an end of life state ($SOH_{20}$) associated with a maximum depth of discharge limit threshold ($MDOD_{20}$);
    while using the battery, a step of adjusting the maximum depth of discharge of the battery according to the current state of health of the battery; and,
    wherein the maximum depth of discharge of the battery is adjusted at regular intervals, each time the state of health of the battery decreases by a percentage corresponding to an update interval p % that is equal to p/100, that is, for all state of health values ($SOH_n$) that are equal to $SOH_0$-n×p %, where n is an integer comprised between 0 and 20/p.

2. The method according to claim 1, wherein the maximum depth of discharge ($MDOD_n$) of the battery is adjusted to the state of health according to the following relation:

$$MDOD_n = \left(\frac{1}{1 - p/100}\right)^n MDOD_0.$$

3. The method according to claim 1, wherein the update interval p % is lower than or equal to 1%.

4. The method according to claim 1, wherein the initial value ($MDOD_0$) and the maximum depth of discharge (MDOD) profile are determined in the predetermination step such that the depth of discharge of the battery is, over the service life of the battery, always or nearly always lower than a maximum value.

5. The method according to claim 1, wherein the initial value ($MDOD_0$) and the maximum depth of discharge (MDOD) profile are determined according to the limit threshold value ($MDOD_{20}$).

6. The method according to claim 1, in which a maximum charge setpoint is provided during the charging phases of the battery, the maximum charge setpoint varying upwards so as to maintain a substantially constant available energy level over the service life of the battery while limiting overcharge-related risks.

7. A method for managing a specific battery according to a state of health of the battery, comprising:
    setting a maximum depth of discharge profile according to the state of health of the battery, the maximum depth of discharge profile being a percentage maximum electrical discharge consumed in a single discharging phase of the battery with respect to the capacity of the battery at that discharging phase, and said maximum depth of discharge, and the maximum depth of discharge profile being an upward profile, which is determined by:
        the technology of the specific battery,
        a substantially constant nominal energy level to be made available each time the specific battery is discharged, and
        a limit threshold value of the maximum depth of discharge;
    while using the battery, a step of adjusting a maximum depth of discharge of the battery according to the current state of health of the battery;
    wherein the maximum depth of discharge of the battery is adjusted at regular intervals, each time the state of health of the battery decreases by a percentage corresponding to an update interval p % that is equal to p/100, that is, for all state of health values ($SOH_n$) that are equal to $SOH_0$-n×p %, where n is an integer comprised between 0 and 20/p,
    wherein, the maximum depth of discharge ($MDOD_n$) of the battery is adjusted to the state of health according to the following relation:

$$MDOD_n = \left(\frac{1}{1 - p/100}\right)^n MDOD_0.$$

* * * * *